United States Patent [19]

Harada

[11] Patent Number: 4,942,311

[45] Date of Patent: Jul. 17, 1990

[54] RESET CIRCUIT FOR AN AUTOMOBILE ANTENNA CONTROL DEVICE

[75] Inventor: Takuji Harada, Kanagawa, Japan

[73] Assignee: Harada Kogyo Kabushiki Kaisha, Tokyo, Japan

[21] Appl. No.: 449,506

[22] Filed: Dec. 4, 1989

Related U.S. Application Data

[63] Continuation of Ser. No. 254,356, Oct. 6, 1988, abandoned.

[30] Foreign Application Priority Data

Aug. 10, 1987 [JP] Japan ............................... 62-254246

[51] Int. Cl.[5] ....................... H01Q 1/32; H03K 17/22; H03K 17/20; H03K 17/06

[52] U.S. Cl. ............................... 307/272.3; 307/296.4; 343/901; 343/903; 343/715; 371/12

[58] Field of Search ............... 307/10 R, 272.3, 296.4, 307/592, 594, 603; 343/901, 903, 715; 371/12

[56] References Cited

U.S. PATENT DOCUMENTS

| | | | |
|---|---|---|---|
| 4,307,306 | 12/1981 | Kucharewski | 307/592 X |
| 4,410,991 | 10/1983 | Lenart | 371/12 X |
| 4,528,629 | 7/1985 | Breitling | 307/592 X |
| 4,536,667 | 8/1985 | Masuda | 307/592 |
| 4,670,676 | 2/1987 | Nishitani | 307/592 |
| 4,733,101 | 3/1988 | Graham et al. | 307/10 R |
| 4,766,335 | 8/1988 | Shiraishi et al. | 307/592 |
| 4,788,454 | 11/1988 | Tanagawa et al. | 307/296 R |

*Primary Examiner*—Stanley D. Miller
*Assistant Examiner*—David R. Bertelson
*Attorney, Agent, or Firm*—Koda & Androlia

[57] ABSTRACT

An automobile antenna control device generating a reset pulse which starts the operation of a microcomputer. The pulse is generated when an automobile radio power source is switched from "off" to "on," or when the power source is switched from "on" to "off," so that a so-called runaway of the microcomputer can be prevented. The power source is connected to an input port of the microcomputer; the antenna is extended when the power source is "on," and is retracted when the power source is "off." The extending or retracting action of the antenna is stopped when the starter power source of the master key switch of the automobile is "on."

3 Claims, 3 Drawing Sheets

| OPERATION OF POWER SOURCE SWITCH 30 | OFF | ON | | OFF | |
|---|---|---|---|---|---|
| | | FOR PRESCRIBED TIME AFTER "ON" | AFTER PRESCRIBED TIME HAS PASSED FOLLOWING "ON" | FOR PRESCRIBED TIME AFTER "OFF" | AFTER PRESCRIBED TIME HAS PASSED FOLLOWING "OFF" |
| INPUT TERMINAL 43a | 0 | 1 | 1 | 0 | 0 |
| INPUT TERMINAL 43b | 0 | 0 | 1 | 1 | 0 |
| OUTPUT OF EX. NOR 43 | 1 | 0 | 1 | 0 | 1 |
| ACTUATION OF MICROCOMPUTER 20 | SET | RESET | SET | RESET | SET |

RESET CIRCUIT FOR AN AUTOMOBILE ANTENNA CONTROL DEVICE

This is a continuation of application Ser. No. 254,356, filed Oct. 6, 1988, now abandoned.

BACKGROUND OF THE INVENTION

1. Field of the Invention

The present invention relates to an automobile antenna control device which is equipped with a microcomputer.

2. Prior Art

Conventional automobile antenna control devices have included devices which use a microcomputer. The operation of such a conventional device is illustrated in FIG. 4 and described as follows:

First, if the starter power source is "on" (S1), extending and/or retracting of the antenna is stopped in midaction (S2). If the starter power source is "off," the status of the radio circuit power source is checked (S3). If the radio circuit power source is "on," the antenna is extended (S4). If the radio circuit power source is "off," the antenna is retracted (S5).

In general, the above mentioned microcomputer is maintained in an actuated state over a long period of time. Accordingly, the microcomputer may be placed in a so-called "runaway" state by an external surge voltages (ordinarily referred to as "external noise") during this period. As a result of this runaway state, the microcomputer becomes uncontrollable. In order to extract the microcomputer from this runaway state, a runaway detecting circuit (referred to as a "watchdog") is installed in conventional devices. When the microcomputer goes into a runaway state, the microcomputer is temporarily reset, so that stable operation is insured.

In the case of general microcomputers which are used in applications other than automobiles, and in which the operation is begun when the power source is switched "on," a power-source-"on" resetting circuit which resets the microcomputer when power begins to be supplied from the power source is sometimes installed, so that normal operation of the microcomputer is insured by this circuit.

However, in the case of the above described conventional devices, the cost of the watchdog is greater than the cost of the microcomputer. As a result, the automobile antenna control device as a whole is increased to a high cost.

In such a case, it would be conceivable to install a resetting circuit constructed with a reset button instead of a watchdog and to have the vehicle operator press this reset button in the case of runaway operation of the microcomputer. In this case, however, the reset button must be installed in a place which ordinarily cannot be reached by the vehicle operator. If this is done, then it is difficult for the vehicle operator to find the reset button when the microcomputer goes into runaway operation. Accordingly, in such cases, the vehicle operator will judge that the antenna control device has malfunctioned, so that maintenance costs are incurred.

Incidentally, since it is sometimes necessary to operate the automobile antenna even when the radio power source is "off," it is not possible to switch the microcomputer power source "on" and "off" simultaneously with the radio power source. Accordingly, the conventional power-source-"on" resetting circuit which resets the microcomputer when the power source is switched "on" cannot be used "as is" in an automobile antenna control device.

SUMMARY OF THE INVENTION

Accordingly, it is a general object of the present invention to overcome the disadvantages of the prior art.

In the present invention, a reset pulse which starts the operation of a microcomputer is generated when the automobile radio power source (which is the signal source that determines the extension or retraction of the antenna) is switched from "off" to "on," or when the power source is switched from "on" to "off."

In the present invention, a reset pulse which starts the operation of the aforementioned microcomputer is generated when the automobile radio power source (which is the signal source that determines the extension or retraction of the antenna) is switched from "off" to "on," or when the power source is switched from "on" to "off." Accordingly, the cost of the means used to extract the microcomputer from a runaway operation, the microcomputer can be reliably extracted from the runaway state.

BRIEF DESCRIPTION OF THE DRAWINGS

The above mentioned features and objects of the present invention will become more apparent from the following description with reference to the following drawings wherein like reference numerals denote like elements and in which.

DETAILED DESCRIPTION OF THE INVENTION

Figure 1:
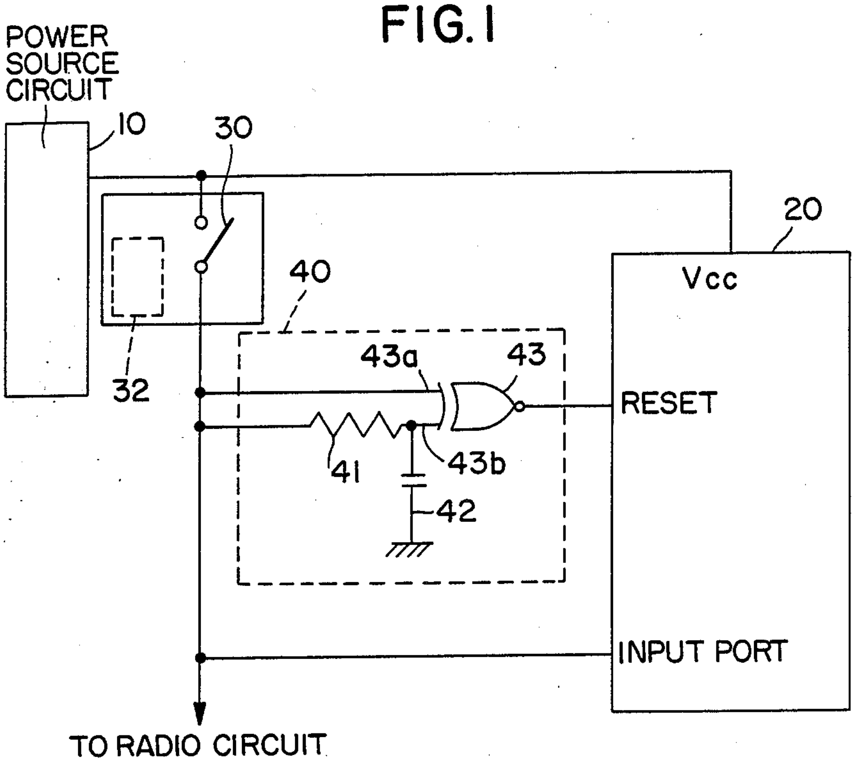
FIG. 1 is a circuit diagram which illustrates one embodiment of the present invention.

FIG. 1 is a circuit diagram which illustrates one appropriate embodiment of the present invention.

The microcomputer 20 performs overall control of an automobile antenna, i.e., control of the extending and retracting action of the antenna (not shown in the Figures), etc. The microcomputer 20 is constantly supplied with power by a power source circuit 10. Furthermore, a radio switch 30 which is installed inside the radio 31 is installed between this power source circuit 10 and radio circuit 32. A resetting circuit 40 is installed between this radio switch 30 and the reset terminal of the microcomputer 20. Furthermore, the radio switch 30 generates signals which determine the extension or retraction of the antenna.

The resetting circuit 40 includes an exclusive "or" circuit 43, a resistor 41 and a capacitor 42. The resistor 41 and capacitor 42 form a time constant circuit, and the exclusive "or" circuit 43 has two input terminals 43*a* and 43*b*. This resetting circuit 40 is one example of a means for generating a reset pulse which starts the operation of the microcomputer when the automobile radio power source (which is the signal source that determines the extension or retraction of the antenna) is switched from "off" to "on," or when the power source is switched from "on" to "off."

Furthermore, in FIG. 1, the input port of the microcomputer 20 is an input port via which data which determines whether it is necessary to extend the antenna or to retract the antenna is inputted. Specifically, the input port is connected to the automobile radio power source and is designed so that the antenna is extended when the power source is "on," the antenna is retracted when the power source is "off," and the extending or retracting action of the antenna is stopped when the starter power source of the master key switch of the automobile is "on."

Figure 2:
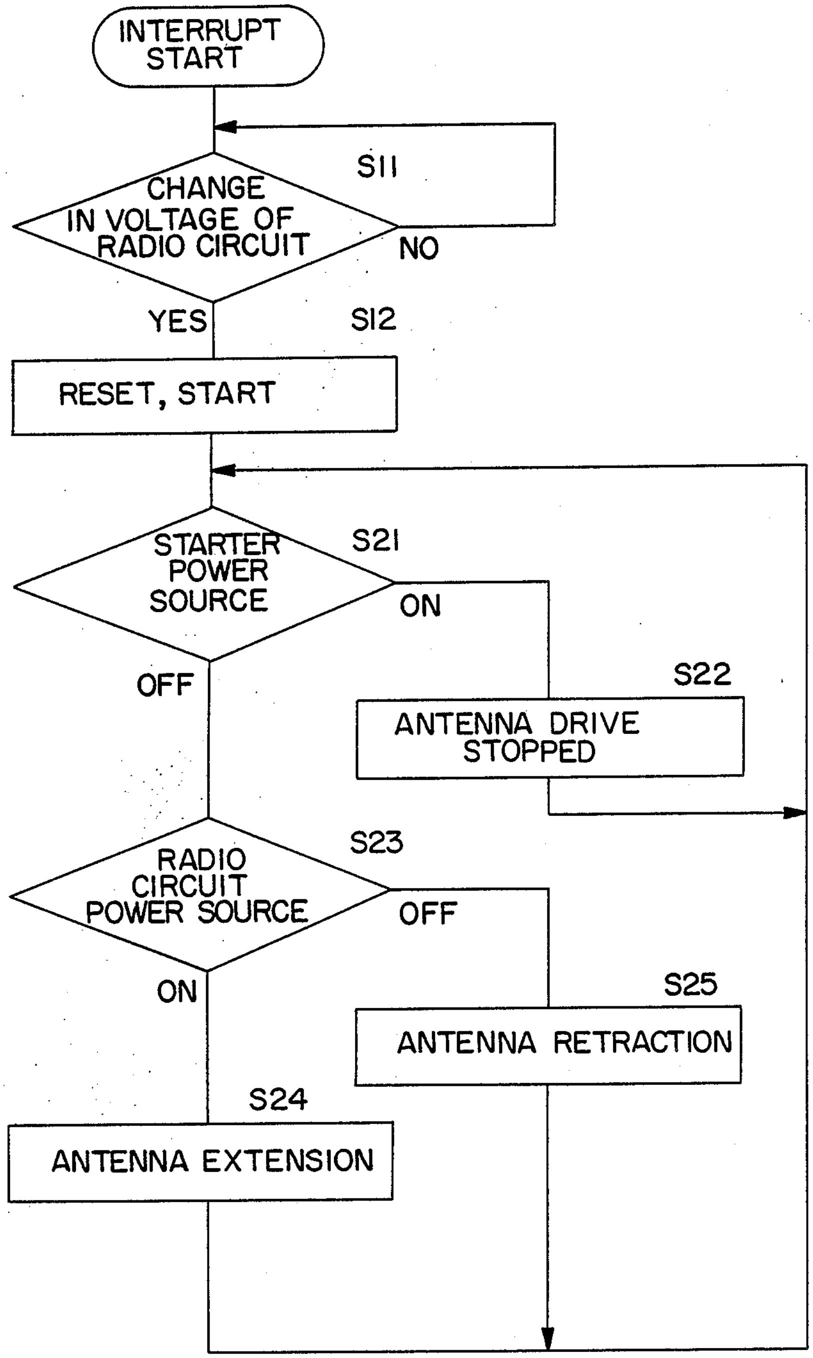
FIG. 2 is a flow chart which illustrates the operation of the embodiment of FIG. 1.

Next, operation of the above described embodiment will be described, and FIG. 2 is a flow chart which illustrates the operation of the above described embodiment.

First, an interrupt is started, and it is ascertained whether or not there has been a change in the voltage of the radio circuit (S11). In this case, the resetting circuit 40 detects any voltage change in the radio circuit. If there is a voltage change, the output of the resetting circuit 40 is "0". This voltage change detection will be described in detail later.

If there is a change in the voltage of the radio circuit, the resetting circuit 40 generates a reset pulse, so that the microcomputer 20 is reset, after which the microcomputer 20 starts normally (S12).

In this case, if the starter power source is "on" (S21), the driving of the extension or retraction of the antenna is stopped in mid-action (S22). If the starter power source is "off," the extension or retraction of the antenna is controlled in accordance with the radio circuit power source (S23). In other words, if the radio circuit power source is "on," the antenna driving motor (not shown in the Figures) is caused to rotate in the forward direction so that the antenna is extended (S24); and when the antenna is in a fully extended position, the antenna driving motor is stopped.

On the other hand, if the radio circuit power source is "off" (S23), the antenna driving motor is caused to rotate in the reverse direction so that the antenna is retracted (S25). Furthermore, when the antenna is fully retracted, the antenna driving motor is stopped.

Thus, the microcomputer 20 is reset every time there is a change in the voltage of the radio circuit. Accordingly, even if the microcomputer 20 should go into runaway operation, the microcomputer 20 can be normally controlled by the subsequent resetting. Furthermore, the microcomputer 20 can be extracted from a runaway state by operating the radio or the master key of the automobile itself; accordingly, the microcomputer 20 is extracted from the runaway state before the vehicle operator is aware that there is any problem.

Furthermore, in the above described embodiment, the means used to extract the microcomputer 20 from a runaway state consists only of an exclusive "or" circuit 43 and time constant circuits 41 and 42. Accordingly, the cost of this means for extracting the microcomputer 20 from a runaway state is low.

Figures 3, 4:
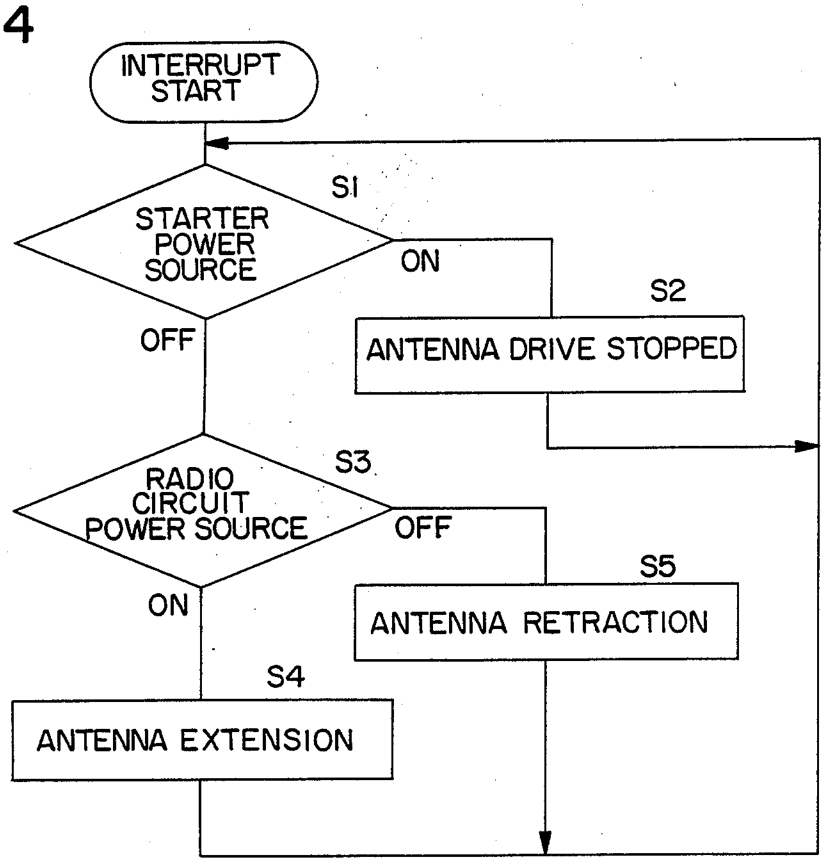
FIG. 3 is a table which illustrates the relationship between the radio switch and the actuation of the microcomputer.
FIG. 4 is a flow chart which illustrates the operation of a conventional example.

FIG. 3 is a table which illustrates the relationship between the operation of the radio switch 30 and the actuation of the microcomputer 20.

First, in a case where the radio switch 30 is "off" for a long period of time, the two input terminals 43*a* and 43*b* of the exclusive "or" circuit 43 are both "0"; accordingly, the output of the exclusive "or" circuit 43 is "1," so that the microcomputer 20 is set. Afterward, if the radio switch 30 is switched "on," the input terminal 43*a* immediately goes to "1" ; but the input terminal 43*b* remains at "0" for a prescribed period of time due to the time constant circuits 41 and 42. Accordingly, the output of the exclusive "or" circuit 43 is "0," and the microcomputer 20 is reset for this prescribed period of time. If the microcomputer 20 has been in a runaway state immediately prior to this, the runaway state is terminated. After the above mentioned prescribed period of time has passed, the input terminal 43*b* goes to "1," so that the output of the exclusive "or" circuit 43 changes to "1," and the microcomputer 20 is set.

Meanwhile, when the radio switch 30 is switched from "on38 to "off," the input terminal 43*a* immediately goes to "0," but the input terminal 43*b* remains at "1" for a prescribed period of time due to the time constant circuits 41 and 42. Accordingly, the exclusive "or" circuit 43 outputs "0," so that the microcomputer 20 is reset for this prescribed period of time. If the microcomputer 20 has been in a runaway state immediately prior to this, the runaway state is terminated. Then, after the period of time has passed, the input terminal 43*b* also outputs "0," so that the microcomputer 20 is set. Thus, the microcomputer 20 is reset for a prescribed period of time after the radio switch 30 is switched "on," and for a prescribed period of time after the radio switch 30 is switched "off."

Figure 5:
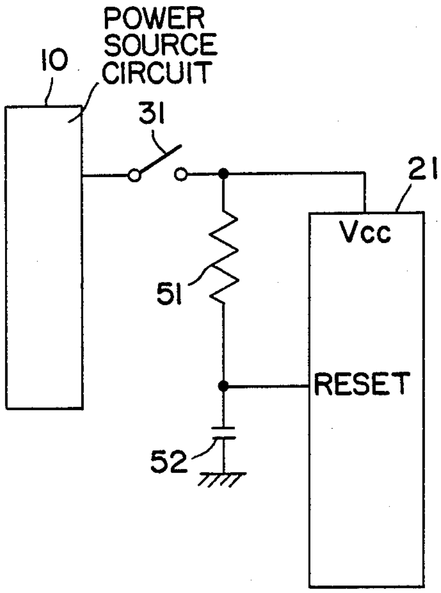
FIGS. 5 and 6 are circuit diagrams which illustrate the resetting circuits of general microcomputers.
Figure 6:
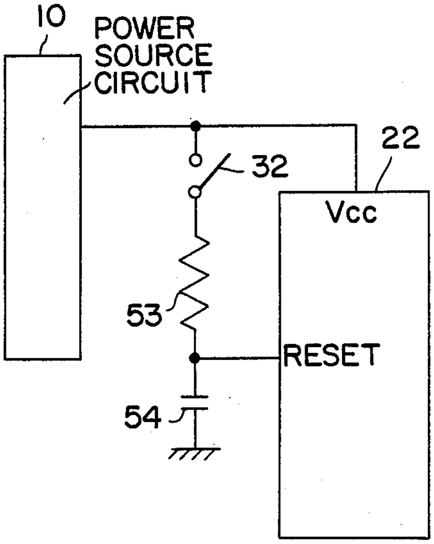

FIGS. 5 and 6 are circuit diagrams which illustrate general microcomputers 21 and 22 used in applications other than automobile antenna control devices, and the resetting circuits of the microcomputers.

In these Figures, when the power source switch 31 or 32 is switched "off," the time constant circuit 51 and 52 or time constant circuit 53 and 54 outputs "0" after a prescribed period of time has passed; subsequently, the microcomputer 21 or 22 rests until the power source switch is switched "on." In the case of an automobile antenna control device, on the other hand, the action which retracts the antenna remains to be performed even after the radio power source switch is switched "off." Accordingly, the microcomputer must be maintained in an actuated state until this retracting action is completed (i.e., the microcomputer cannot be reset until such action is completed). Thus, the general resetting circuits illustrated in FIGS. 5 and 6 cannot be used "as is" in an automobile antenna control device.

In the embodiment illustrated in FIG. 1, the microcomputer 20, which is normally in an ON state, is set after a prescribed period of time has passed following the switching "off" of the radio power source switch 30. Therefore, in this case, the action which retracts the antenna can be performed.

Furthermore, a circuit other than the above mentioned resetting circuit 40 may be used as long as the circuit generates a reset pulse when the automobile radio power source is switched from "off" to "on," or when the power source is switched from "on" to "off."

From the above description it should be apparent that the present invention possesses the following merits: The cost of the means used to extract the microcomputer from a runaway state is low, and even if the microcomputer should go into runaway operation, the microcomputer can be reliably extracted from said runaway state.

I claim:

1. An automobile antenna control device comprising:

a microcomputer which is constantly supplied with electric power for controlling extension and retraction of said automobile antenna, said microcomputer having a reset input and an input port;

means for generating a reset signal only when a condition of a power switch of an automobile radio changes from off to on or on to off; and a means for sensing a condition of said power switch of said automobile radio, said sensing means having an ouput thereof coupled to said generation means and said input port of said microcomputer;

whereby run away operation of said microcomputer can be prevented during a change in condition of said power switch of said automobile radio and said automobile antenna is retracted when said power switch is off and extended when said power switch is on.

2. An automobile antenna control device according to claim 1 wherein said sensing means comprises an exclusive OR circuit.

3. An automobile antenna control device according to claim 1 wherein when a master key switch of said automobile is turned on to start the automobile, extension and retraction of said antenna is halted under the control of said microcomputer.

* * * * *